United States Patent
Shadel et al.

(10) Patent No.: US 8,779,301 B2
(45) Date of Patent: Jul. 15, 2014

(54) MONITORING SYSTEM FOR USE IN MONITORING THE OPERATION OF MACHINERY AND METHOD OF RETROFITTING MONITORING SYSTEM

(75) Inventors: Bryan Shadel, Gardnerville, NV (US); Michael Alan Tart, Gardnerville, NV (US); Sean Kelly Summers, Carson City, NV (US); Lysle Rollan Turnbeaugh, Carson City, NV (US); Han Tran, Gardenerville, NV (US); Mitchell Dean Cohen, Carson City, NV (US); Steven Thomas Clemens, Carson City, NV (US)

(73) Assignee: General Electric Company, Houston, TX (US)

( * ) Notice: Subject to any disclaimer, the term of this patent is extended or adjusted under 35 U.S.C. 154(b) by 231 days.

(21) Appl. No.: 12/875,543

(22) Filed: Sep. 3, 2010

(65) Prior Publication Data
US 2012/0055709 A1 Mar. 8, 2012

(51) Int. Cl.
*H05K 9/00* (2006.01)
*H02B 1/56* (2006.01)
(52) U.S. Cl.
USPC .......................... 174/351; 174/383; 361/800
(58) Field of Classification Search
USPC ........... 174/377, 382, 383, 351; 361/816, 800
See application file for complete search history.

(56) References Cited

U.S. PATENT DOCUMENTS

| | | | |
|---|---|---|---|
| 6,243,265 B1 | 6/2001 | Wong et al. | |
| 6,366,472 B2 | 4/2002 | Alina et al. | |
| 6,477,061 B1 * | 11/2002 | Johnson | 361/818 |
| 6,538,902 B1 * | 3/2003 | Beard | 361/818 |
| 6,653,557 B2 | 11/2003 | Wolf et al. | |
| 6,775,131 B2 * | 8/2004 | Hanson | 361/679.58 |
| 6,825,411 B2 * | 11/2004 | Pommerenke et al. | 174/388 |
| 6,860,641 B1 | 3/2005 | Goldenburg et al. | |
| 6,967,280 B1 | 11/2005 | Boatwright et al. | |
| 7,081,587 B1 * | 7/2006 | Woolsey | 174/365 |
| 7,238,893 B2 * | 7/2007 | Hensley et al. | 174/351 |
| 7,259,969 B2 | 8/2007 | Zarganis et al. | |
| 7,369,416 B2 * | 5/2008 | Plabst | 361/818 |
| 7,511,970 B2 | 3/2009 | Justason et al. | |
| 2002/0012237 A1 * | 1/2002 | Dimarco | 361/796 |

* cited by examiner

*Primary Examiner* — Hung Ngo
(74) *Attorney, Agent, or Firm* — Fletcher Yoder, P.C.

(57) ABSTRACT

A housing for use in a monitoring system having at least one monitoring module includes a shell defining an interior cavity. At least one opening is defined in the shell, and the at least one opening is in flow communication with the interior cavity. The housing includes at least one gasket coupled to the shell about an outer perimeter of the at least one opening. The at least one gasket facilitates insulating the interior cavity from electromagnetic radiation when the at least one monitoring module is positioned within the housing.

16 Claims, 4 Drawing Sheets

MONITORING SYSTEM FOR USE IN MONITORING THE OPERATION OF MACHINERY AND METHOD OF RETROFITTING MONITORING SYSTEM

BACKGROUND OF THE INVENTION

The present application relates generally to monitoring systems and, more particularly, to monitoring systems for use in monitoring the operation of machinery and a method of retrofitting a monitoring system.

Known machines may exhibit vibrations or other abnormal behavior during operation. One or more sensors may be used to measure and/or monitor such behavior and to determine, for example, an amount of vibration exhibited in a motor drive shaft, a rotational speed of the motor drive shaft, and/or any other suitable operational characteristic of an operating machine or motor. Often, the sensors are coupled to a monitoring system that includes a plurality of monitors. The monitoring system receives signals representative of measurements from one or more sensors, performs at least one processing step on the signals, and then transmits the modified signals to a diagnostic platform that displays the measurements to a user via at least one monitor.

At least some known monitoring systems include at least one electrical bus within a system backplane that is used to couple the sensors to one or more monitors. A secondary backplane may be coupled to the system backplane to enable high-speed monitors to be used with the monitoring system. High-speed monitors and/or secondary backplanes may transmit one or more high-speed signals to each other. However, during transmission of such high-speed signals, electromagnetic radiation may be generated that may present safety concerns and/or that may violate one or more regulatory standards.

BRIEF DESCRIPTION OF THE INVENTION

In one embodiment, a housing for use in a monitoring system having at least one monitoring module is provided that includes a shell defining an interior cavity. At least one opening is defined in the shell, and the at least one opening is in flow communication with the interior cavity. The housing includes at least one gasket coupled to the shell about an outer perimeter of the at least one opening. The at least one gasket facilitates insulating the interior cavity from electromagnetic radiation when the at least one monitoring module is positioned within the housing.

In another embodiment, a monitoring system for use in monitoring the operation of a machine is provided that includes at least one monitoring module and a first housing including a shell that defines an interior cavity. At least one opening is defined in the shell, and the at least one opening is in flow communication with the interior cavity. At least one gasket is coupled to the shell about an outer perimeter of the at least one opening. The at least one gasket facilitates insulating the interior cavity from electromagnetic radiation when the at least one monitoring module is positioned within the first housing.

In yet another embodiment, a method of retrofitting a monitoring system is provided. The method includes providing a first housing that includes at least one legacy monitoring module positioned therein, removing the at least one legacy monitoring module from the first housing, and inserting a second housing at least partially within the first housing. The second housing includes a shell defining an interior cavity, wherein the shell includes a rear portion defining at least one opening in flow communication with the interior cavity, and at least one gasket coupled to the rear portion, the at least one gasket facilitates insulating the interior cavity from electromagnetic radiation. At least one upgraded monitoring module is inserted into the second housing.

DETAILED DESCRIPTION OF THE INVENTION

Figure 1:
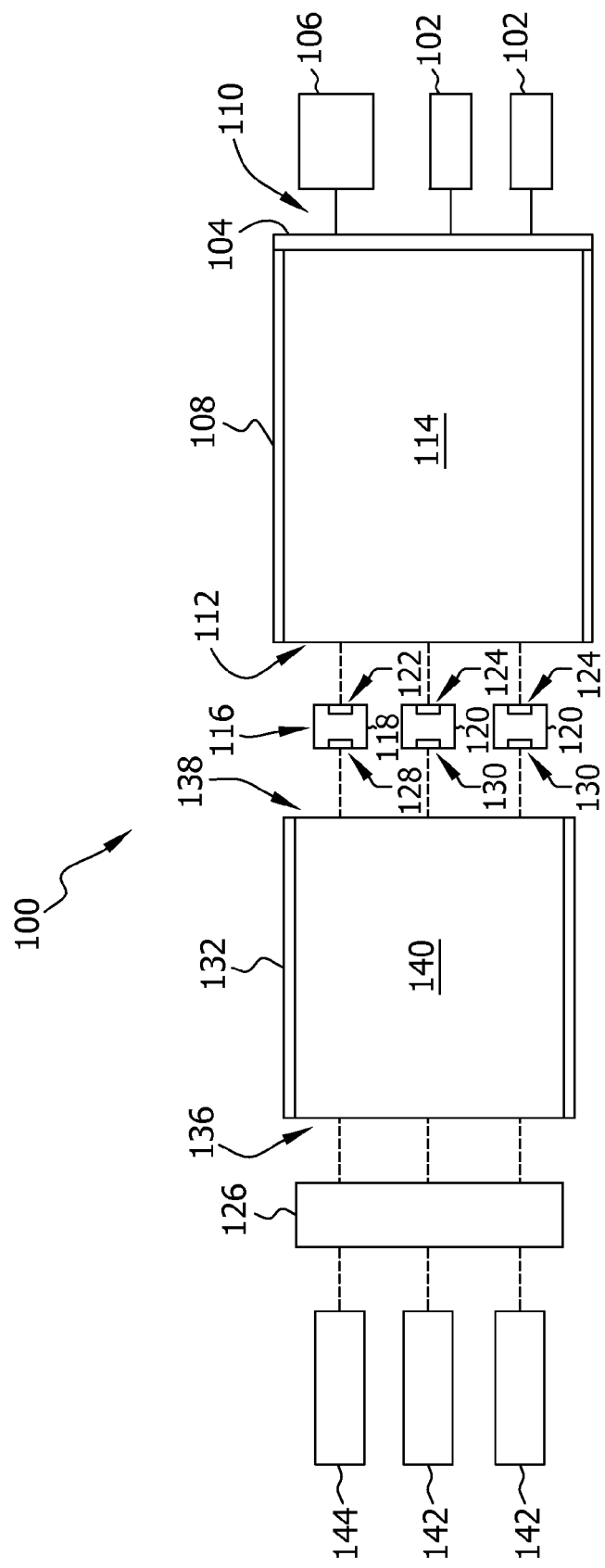
FIG. 1 is a side cross-sectional view of an exemplary monitoring system that may be used to monitor the operation of a machine.

FIG. 1 is a side cross-sectional view of an exemplary monitoring system 100 that may be used to monitor the operation of a machine (not shown). In the exemplary embodiment, monitoring system 100 monitors, detects, and/or measures one or more operating conditions of one or more machines using one or more transducers 102 or other sensors. More specifically, in the exemplary embodiment, transducers 102 are coupled to a system backplane 104 that receives signals from transducers 102. The signals are indicative of measured operating conditions of the machine and/or one or more components of the machine. Moreover, in the exemplary embodiment, monitoring system 100 receives power from a power supply 106 that is coupled to system backplane 104. Alternatively, monitoring system 100 may receive power from any suitable power source that enables system 100 to function as described herein. In the exemplary embodiment, system backplane 104 includes a monitoring system bus (not shown in FIG. 1) that includes a plurality of conductors (not shown). As used herein, the term "couple" is not limited to a direct mechanical and/or an electrical connection between components, but may also include an indirect mechanical and/or electrical connection between components.

System backplane 104 is positioned within a main housing 108. In the exemplary embodiment, system backplane 104 is positioned towards, or adjacent to, a rear portion 110 of main housing 108. A front portion 112 of main housing 108 is open to an external environment. Main housing 108 includes a main cavity 114 defined therein that is in flow communication with front portion 112.

In the exemplary embodiment, monitoring system 100 includes a plurality of interface boards 116 coupled to system backplane 104. More specifically, in the exemplary embodiment, interface boards 116 are coupled to system backplane 104 through front portion 112. Alternatively, interface boards 116 may couple to system backplane 104 at any location within monitoring system 100. Furthermore, in the exemplary embodiment, interface boards 116 include at least a system interface board 118 and at least one monitor interface board 120. Although only two monitor interface boards 120 are illustrated in FIG. 1, it should be noted that FIG. 1 is exemplary and is not intended to limit the invention in any manner.

System interface board 118 is coupled to system backplane 104 via a system interface input connector 122. Moreover, in the exemplary embodiment, monitor interface board 120 is coupled to system backplane 104 via a monitor interface input connector 124. Monitoring system 100 includes an intermediate backplane 126 that electrically couples to system backplane 104. In the exemplary embodiment, intermediate backplane 126 is coupled to system backplane 104 through interface boards 116. More specifically, in the exemplary embodiment, intermediate backplane 126 couples directly to interface boards 116, and interface boards 116 couple directly to system backplane 104.

In the exemplary embodiment, intermediate backplane 126 is coupled to an electromagnetically shielded intermediate housing 132. Intermediate housing 132 facilitates insulating, or reducing the electromagnetic radiation generated by, intermediate backplane 126 and/or any suitable component within intermediate housing 132 from escaping from housing 132 to an external environment. Moreover, intermediate housing 132 facilitates reducing an amount of electromagnetic radiation that is received by intermediate backplane 126 and/or any suitable component within intermediate housing 132 from a source external to intermediate housing 132, such as from the external environment. In the exemplary embodiment, housing 132 includes a front opening 136 and at least one rear opening 138. An intermediate cavity 140 defined within housing 132 is in flow communication with front opening 136 and rear opening 138. In one embodiment, intermediate backplane 126 is coupled within intermediate cavity 140 adjacent to rear opening 138. Interface boards 116 extend at least partially through rear opening 138 when coupled to intermediate backplane 126. Alternatively, intermediate backplane 126 and/or interface boards 116 may be positioned in any suitable location within intermediate housing 132 and/or main housing 108 that enables monitoring system 100 to function as described herein.

Monitoring system 100 includes at least one transducer monitoring module 142 that processes at least one signal from transducers 102. As used herein, the term "process" refers to performing an operation on, adjusting, filtering, buffering, and/or altering at least one characteristic of a signal. In the exemplary embodiment, monitoring system 100 includes any number of transducer monitoring modules 142 that enable system 100 to function as described herein. Monitoring modules 142 are coupled to intermediate backplane 126 and are at least partially within intermediate housing 132. As such, in the exemplary embodiment, signals from transducers 102 are transmitted to transducer monitoring modules 142 through system backplane 104, interface boards 116, and intermediate backplane 126. Moreover, at least one signal may be transmitted between different transducer monitoring modules 142.

In the exemplary embodiment, monitoring system 100 also includes a system monitoring module 144 that is coupled to intermediate backplane 126 and that is at least partially within intermediate housing 132. In the exemplary embodiment, system monitoring module 144 receives data and/or status signals transmitted from transducer monitoring modules 142 and/or from other components of monitoring system 100. System monitoring module 144 processes and/or analyzes the data and/or status signals and transmits the signals to a remote system (not shown), such as a computer system, for display or output to a user.

During assembly, system backplane 104 is coupled to housing rear portion 110. Interface boards 116 are then coupled to system backplane 104 using system interface input connector 122 and monitor interface input connectors 124. Intermediate backplane 126 is coupled within intermediate housing 132 adjacent to rear opening 138, and housing 132 is inserted through housing front portion 112 to enable intermediate backplane 126 to couple to interface boards 116. More specifically, intermediate backplane 126 is coupled to system interface output connector 128 and to monitor interface output connectors 130. Transducer monitoring modules 142 and system monitoring module 144 are inserted through housing front opening 136 and are coupled to intermediate backplane 126. In one embodiment, at least a portion of transducer monitoring modules 142 and/or system monitoring module 144 extends outward from housing front opening 136 into the environment. In an alternative embodiment, any component of monitoring system 100 may be positioned in any suitable location that enables system 100 to operate as described herein. As such, in the exemplary embodiment, when monitoring system 100 is fully assembled, transducer monitoring modules 142, system monitoring module 144, system backplane 104, intermediate backplane 126, intermediate housing 132, and interface boards 116 are at least partially positioned within main housing 108.

Figure 2:
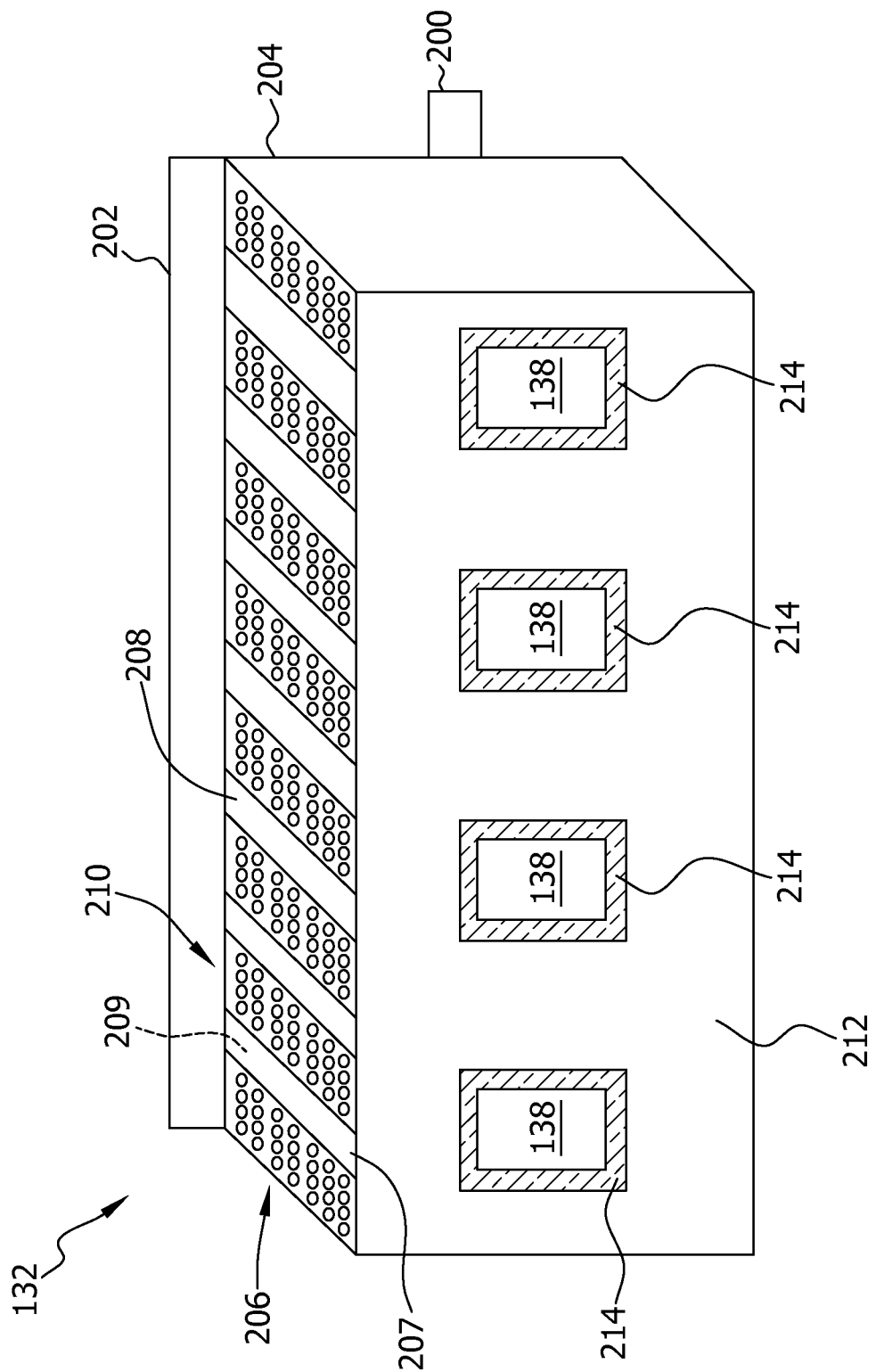
FIG. 2 is a perspective view of an exemplary housing that may be used with the monitoring system shown in FIG. 1.
Figure 3:
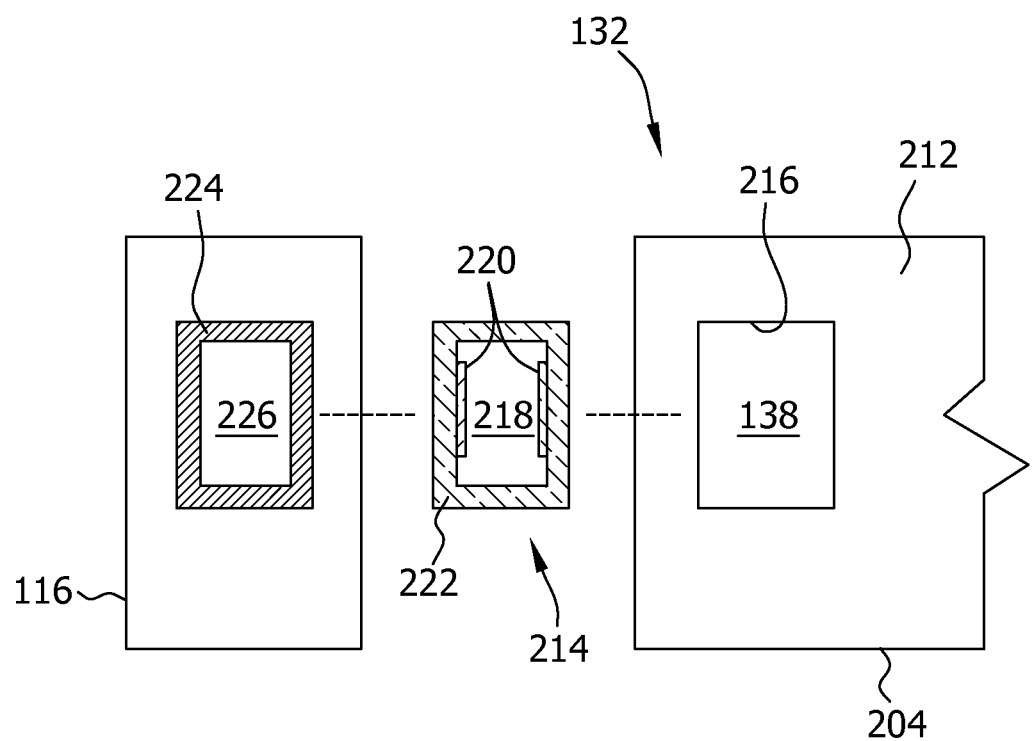
FIG. 3 is an exploded view of a portion of the housing shown in FIG. 2.

FIG. 2 is a perspective view of housing 132 and FIG. 3 is an exploded view of a portion of housing 132. In the exemplary embodiment, intermediate housing 132 is positioned within, and is coupled to, main housing 108 (shown in FIG. 1). More specifically, in the exemplary embodiment, intermediate housing 132 includes a plurality of flanges 200 (shown in FIG. 2) and at least one rim portion 202 that enables intermediate housing 132 to be coupled to main housing 108. For example, flanges 200 and/or rim portion 202 may be coupled to main housing 108 via screws, bolts, rivets, and/or any other suitable fastening mechanism that enables monitoring system 100 to function as described herein.

In the exemplary embodiment, intermediate housing 132 includes a shell 204 that at least partially defines intermediate cavity 140 (shown in FIG. 1). Shell 204 substantially shields or insulates intermediate housing 132 from electromagnetic radiation generated within intermediate cavity 140 and/or from electromagnetic radiation external to intermediate housing 132. More specifically, in the exemplary embodiment, shell 204 is fabricated from nickel-plated steel. Alternatively, shell 204 may be fabricated from any suitable material that substantially prevents electromagnetic radiation generated by one or more components within intermediate cavity 140 from escaping into an external environment and/or that substantially prevents electromagnetic radiation external to intermediate cavity 140 from entering cavity 140. As used herein, the terms "insulate" and "shield" refer to protecting a structure from one or more wavelengths of electromagnetic radiation such that the electromagnetic radiation is substantially prevented from entering and/or exiting the structure.

Moreover, in the exemplary embodiment, a plurality of ventilation openings 206 extend through a top portion 208 of shell 204 such that holes 206 are in flow communication with intermediate cavity 140. More specifically, in the exemplary embodiment, ventilation openings 206 extend from an outer surface 207 to an inner surface 209 of top portion 208. Additionally or alternatively, ventilation openings 206 may extend through any portion of intermediate housing 132. Ventilation openings 206 facilitate removing heat that may be generated by a monitoring module (not shown in FIG. 2), such as a transducer monitoring module 142, a system monitoring module 144 (both shown in FIG. 1), and/or any component positioned within intermediate cavity 140. More specifically, in the exemplary embodiment, ventilation openings 206 are arranged in a series of rows 210 such that when transducer monitoring module 142 and/or system monitoring module 144 are positioned within intermediate cavity 140, ventilation openings 206 are substantially aligned with a plurality of ventilation openings (not shown) defined in each module 142 and/or 144. Alternatively, ventilation openings 206 are positioned in any arrangement within top portion 208 and/or shell 204. In the exemplary embodiment, ventilation openings 206 are sized to substantially prevent electromagnetic radiation from escaping into an external environment from intermediate cavity 140 and/or to substantially prevent electromagnetic radiation from entering into intermediate cavity 140 from the external environment. Moreover, ventilation openings 206 are sized to provide sufficient ventilation to facilitate cooling one or more components within intermediate cavity 140. In the exemplary embodiment, ventilation openings 206 have a diameter of less than about 11.8 inches (in). In a specific embodiment, ventilation openings 206 have a diameter of about 4.9 in. Alternatively, ventilation openings 206 may have a diameter of less than about 19.6 in or any suitable size.

Intermediate housing 132, in the exemplary embodiment, includes a plurality of rear openings 138 that are defined within a rear portion 212 of shell 204. Intermediate backplane 126 is positioned within intermediate cavity 140 and proximate to rear portion 212. Interface boards 116 are positioned outside intermediate housing 132 and proximate to rear portion 212. Moreover, in the exemplary embodiment, each interface board 116 is coupled to intermediate backplane 126 through a respective rear opening 138 via at least one high density connector (not shown) and/or any other connector that enables intermediate housing 132 to function as described herein.

In the exemplary embodiment, at least one rear gasket 214 is coupled to shell 204 about a perimeter 216 of each rear opening 138 to facilitate insulating, or reducing the electromagnetic radiation generated by, intermediate backplane 126 and/or any suitable component within intermediate housing 132 from escaping into an external environment. Moreover, each rear gasket 214 facilitates reducing an amount of electromagnetic radiation that is received by intermediate backplane 126 and/or intermediate housing 132 from the external environment. More specifically, when high density connectors are inserted through rear openings 138, each rear gasket 214 is positioned between perimeter 216 and each high density connector is inserted such that rear gaskets 214 substantially circumscribe and seal rear openings 138. Moreover, in the exemplary embodiment, rear gaskets 214 are manufactured from a metallic material and/or a metal alloy, such as nickel-plated beryllium copper. Alternatively, rear gaskets 214 may be manufactured from any other material, alloy, compound, and/or composition that enables intermediate housing 132 to function as described herein.

As shown in FIG. 3, in the exemplary embodiment, each rear gasket 214 defines an interior opening 218 that is shaped to receive a high density connector (not shown) from interface board 116. Moreover, each rear gasket 214 includes at least one deformable flange 220 that enables each rear gasket 214 to be removably coupled within a respective rear opening 138. Alternatively, rear gaskets 214 are coupled within rear openings 138 via any suitable coupling mechanism (not shown), such as via one or more clips, screws, bolts, pins, via an adhesive, via welding, and/or via any other mechanism that enables intermediate housing 132 to function as described herein.

In the exemplary embodiment, when rear gaskets 214 are coupled within rear openings 138, at least a portion 222 of each rear gasket 214 extends from rear opening 138 and overlaps an area of rear portion 212 surrounding rear opening 138. Moreover, overlapping portion 222 of rear gasket 214 is shaped to substantially match a conductive pad 224 that surrounds a connector 226 of interface board 116, such as system interface output connector 128 or monitor interface output connector 130 (both shown in FIG. 1).

During assembly, rear gasket 214 is inserted at least partially through, and/or coupled within, rear opening 138. A high density connector (not shown) to be coupled to interface board 116, is inserted through rear opening 138 and through rear gasket interior opening 218, and is coupled to intermediate backplane 126. Moreover, at least a portion of interface board 116 is positioned against and/or coupled to rear gasket 214 such that rear gasket 214 substantially seals rear opening 138. More specifically, conductive pad 224 is positioned against and/or is coupled to overlapping portion 222 of rear gasket 214 to facilitate electromagnetically sealing rear opening 138.

Figure 4:
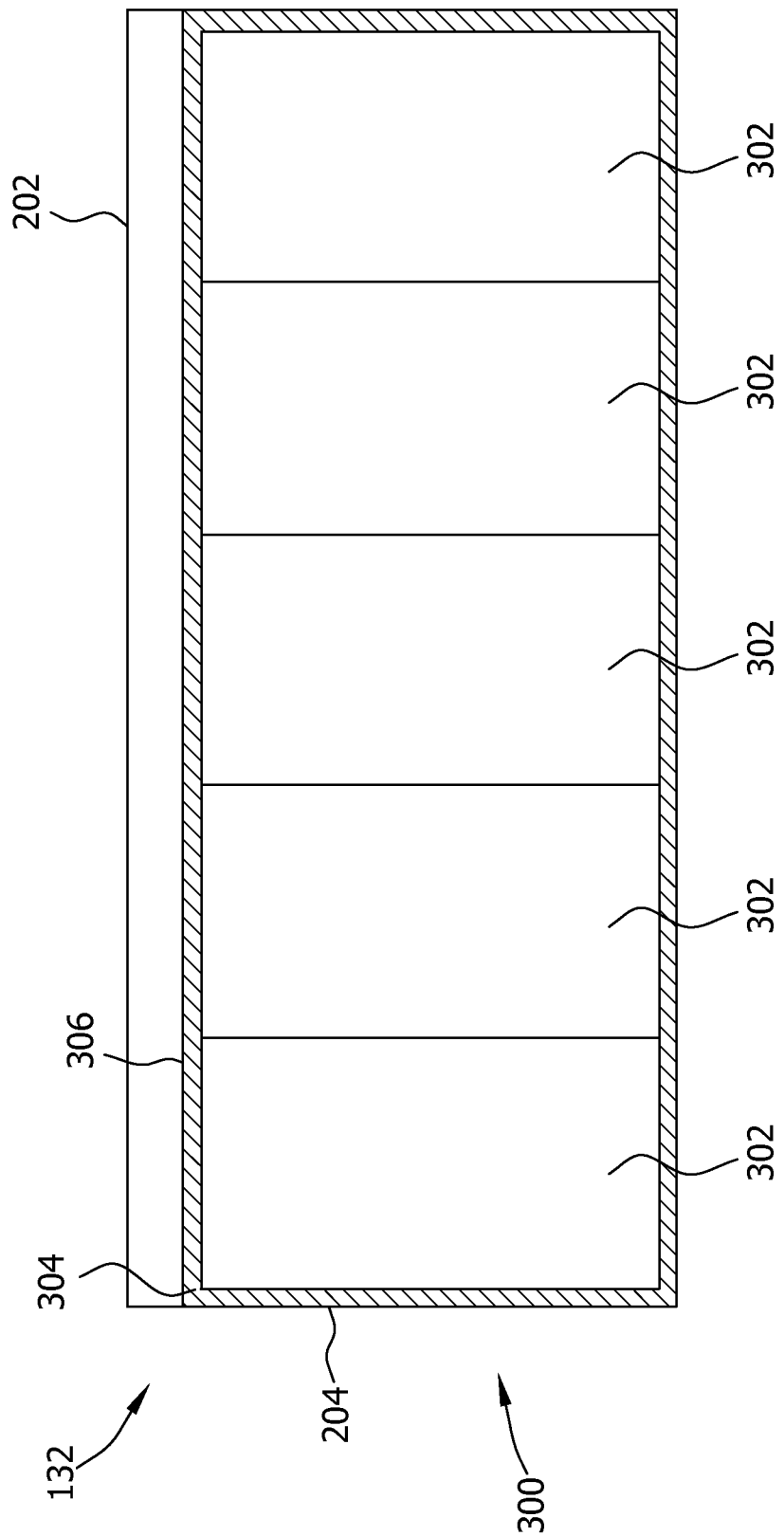
FIG. 4 is a front elevational view of a portion of the housing shown in FIG. 2.

FIG. 4 is a front elevational view of a front portion 300 of intermediate housing 132. A plurality of monitoring modules 302, such as transducer monitoring modules 142 and/or system monitoring module 144 (both shown in FIG. 1), are positioned within intermediate housing 132. Although five monitoring modules 302 are illustrated in FIG. 4, any number of monitoring modules 302 may be positioned within intermediate cavity 140 and/or within intermediate housing 132 to enable monitoring system 100 (shown in FIG. 1) to function as described herein. Moreover, in the exemplary embodiment, at least one gasket 304 is coupled to front portion 300 to facilitate insulating, or reducing the electromagnetic radiation generated by, intermediate backplane 126, monitoring modules 302, and/or any other component within intermediate housing 132 from escaping into an external environment. Additionally, gasket 304 facilitates reducing an amount of electromagnetic radiation that is received by intermediate backplane 126, monitoring modules 302, and/or intermediate housing 132 from the external environment. Gasket 304, in the exemplary embodiment, is manufactured from a metallic material and/or a metal alloy, such as nickel-plated beryllium copper. Alternatively, front gasket 304 may be manufactured from any other material, alloy, compound, and/or composition that enables intermediate housing 132 to function as described herein.

Moreover, in the exemplary embodiment, front gasket 304 is coupled to front portion 300 about an outer perimeter 306 of shell 204. As such, when monitoring modules 302 are positioned within intermediate cavity 140, front gasket 304 is positioned between perimeter 306 and monitoring modules 302 such that monitoring modules 302 are substantially circumscribed. Gasket 304 facilitates electromagnetically sealing front portion 300. In the exemplary embodiment, front gasket 304 is removably coupled to outer perimeter 306 via a deformable flange (not shown) that is substantially similar to flange 220 (shown in FIG. 3). Alternatively, front gasket 304 may be coupled to outer perimeter 306 via any suitable fastening mechanism, such as via one or more clips, screws, bolts, pins, via an adhesive, via welding, and/or any other mechanism that enables intermediate housing 132 to function as described herein.

In the exemplary embodiment, intermediate backplane 126 and/or monitoring modules 302 transmit at least one high-speed signal to each other. As used herein, the term "high-speed" refers to alternating current signals that have frequencies that are higher than signals transmitted within system backplane 104. For example, in one embodiment, high-speed signals have frequencies of about 100 kilohertz or higher. Moreover, in the exemplary embodiment, intermediate housing 132, including shell 204, rear gasket 214, front gasket 304, and/or any other component of intermediate housing 132 substantially insulates intermediate cavity 140 and/or at least one component within intermediate cavity 140 from electromagnetic radiation associated with the signals transmitted within intermediate housing 132 and/or from electromagnetic radiation received from the external environment.

As described herein, intermediate housing 132 includes an electromagnetically shielded shell 204, at least one electromagnetically shielded rear gasket 214, and at least one electromagnetically shielded front gasket 304. Shell 204 and gaskets 214 and 304 facilitate reducing and/or eliminating electromagnetic radiation generated by one or more components within intermediate cavity 140 from escaping to an external environment. As such, an intermediate backplane 126 and/or at least one interface board 116 may be coupled to and/or within intermediate housing 132 while conforming to applicable safety and/or regulatory standards.

Moreover, in the exemplary embodiment, a monitoring system, such as monitoring system 100, may be retrofitted or upgraded such that one or more upgraded monitoring modules may be used with the monitoring system, rather than one or more legacy monitoring modules. As used herein, the term "legacy" refers to a monitoring module and/or another component that is substantially outdated, obsolete, and/or that is replaceable with one or more components that are newer and/or that have more robust and/or updated functionality than the legacy component. As used herein, the term "upgraded" refers to a monitoring module and/or another component that is substantially newer than a legacy component and/or that has more robust and/or updated functionality than a legacy component. For example, in one embodiment, an upgraded monitoring module processes one or more signals that have a higher speed than one or more signals that are processed by a legacy monitoring module. Moreover, an upgraded monitoring module may be smaller and/or larger, i.e., may have a smaller or a larger form factor than a legacy monitoring module.

More specifically, a method of retrofitting a monitoring system, such as monitoring system 100, includes providing a first housing that includes at least one legacy monitoring module positioned therein. Each legacy monitoring module is removed from the first housing, and a second housing is at least partially inserted within the first housing. In the exemplary embodiment, the second housing includes a shell defining an interior cavity, and the shell includes a rear portion defining at least one opening that is in flow communication with the interior cavity. The second housing also includes at least one gasket coupled to the rear portion. The gasket facilitates insulating the interior cavity from electromagnetic radiation. At least one upgraded monitoring module is then inserted into the second housing.

Moreover, in the exemplary embodiment, the first housing includes a first backplane and the second housing includes a second backplane. The second housing is coupled to the first backplane. More specifically, in the exemplary embodiment, at least one interface board is coupled to the first backplane, and the second backplane is coupled to the interface board. Moreover, in the exemplary embodiment, the gasket is coupled to a perimeter of the opening defined in the rear portion, and the second backplane is coupled to the interface board through the opening such that the gasket substantially seals the opening.

At least one upgraded monitoring module, in the exemplary embodiment, is inserted into the second housing, such as into the interior cavity, and is coupled to the second backplane. More specifically, the shell includes a front portion that defines a front opening in flow communication with the interior cavity. At least one gasket is coupled to an outer perimeter of the front portion such that the gasket substantially seals the front opening when the upgraded monitoring modules are inserted through the front opening.

The above-described monitoring systems use an efficient and cost-effective electromagnetically shielded housing. The intermediate housing includes a shell that facilitates reducing electromagnetic emissions from an intermediate cavity. The shell also facilitates reducing an amount of electromagnetic radiation that is received by the intermediate housing from an external environment. A rear portion of the shell includes at least one opening that is sized to receive a data connector from an interface board. At least one gasket facilitates sealing the rear opening after the data connector from the interface board is inserted through the opening. A front portion of the shell includes at least one opening that receives at least one monitoring module. At least one gasket is coupled to the front portion to facilitate sealing the front opening when the monitoring module is positioned within the housing. In contrast to known monitoring systems that do not include an intermediate housing, the intermediate housing and gaskets described herein facilitate reducing and/or preventing an amount of electromagnetic radiation generated by an intermediate backplane and monitoring modules from escaping to an external environment.

Exemplary embodiments of a monitoring system, an intermediate housing for use in a monitoring system, and a method of retrofitting a monitoring system are described above in detail. The system, intermediate housing, and method are not limited to the specific embodiments described herein, but rather, components of the system and/or the intermediate housing and/or steps of the method may be utilized independently and separately from other components and/or steps described herein. For example, the intermediate housing may also be used in combination with other measuring systems and methods, and is not limited to practice with only the monitoring system described herein. Rather, the exemplary embodiment can be implemented and utilized in connection with many other power system applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system, comprising:
   at least one monitoring module;
   a first backplane coupled to the at least one monitoring module;
   an inner housing comprising:
     a shell defining an interior cavity, at least one opening is defined in the shell, the at least one opening is in flow communication with the interior cavity; and
     a plurality of ventilation apertures sized to block electromagnetic radiation from entering or exiting the shell and to simultaneously enable cooling of the at least one monitoring module within the shell;
   at least one gasket coupled to the shell about an entire outer perimeter of the at least one opening, the at least one gasket facilitates insulating the interior cavity from electromagnetic radiation when the at least one monitoring module is positioned within the inner housing;

wherein when the at least one monitoring module is positioned within the inner housing, the at least one gasket is positioned between an interior surface of the shell and an exterior surface of the at least one monitoring module, and substantially circumscribes a portion of the exterior surface of the at least one monitoring module; and an interface board configured to couple to the first backplane through the shell to enable electrical communication between the first backplane and a second backplane in an outer housing.

2. The system of claim 1, wherein the shell is fabricated substantially from a nickel-plated steel material.

3. The system of claim 1, wherein the at least one opening is defined in a front portion of the shell, the at least one front opening is sized to receive the at least one monitoring module therethrough.

4. The system of claim 3, wherein the at least one gasket comprises at least one gasket positioned between the front portion and the at least one monitoring module when the at least one monitoring module is positioned within the interior cavity.

5. The system of claim 1, wherein the at least one opening comprises at least one opening defined in a rear portion of the shell, the at least one opening is sized to receive at least one high density connector.

6. The system of claim 1, wherein the at least one monitoring module comprises a plurality of module ventilation apertures that substantially align with the housing ventilation apertures.

7. A monitoring system for use in monitoring operation of a machine, the monitoring system comprising:
at least one monitoring module;
a first housing comprising:
  a shell defining an interior cavity, a first opening in a front portion of the shell and a second opening in a rear portion of the shell, wherein the first and second openings are in flow communication with the interior cavity; and
  a first gasket coupled to the shell about an entire outer perimeter of the first opening and a second gasket coupled to the shell about an entire outer perimeter of the second opening, wherein the first and second gaskets insulate the interior cavity from electromagnetic radiation when the at least one monitoring module is positioned within the first housing, wherein when the at least one monitoring module is positioned within the first housing, the first gasket is positioned between an interior surface of the shell and an exterior surface of the at least one monitoring module, and substantially circumscribes a portion of the exterior surface of the at least one monitoring module;
a first backplane positioned between the monitoring module and the rear portion of the shell; and an interface board configured to couple to the first backplane through the shell to enable electrical communication between the first backplane and a second backplane in an outer housing.

8. The system of claim 7, wherein the second gasket comprises a deformable flange configured to couple the second gasket to the second opening.

9. The monitoring system in accordance with claim 7, further comprising a second housing, the first housing configured to be coupled within the second housing.

10. The monitoring system in accordance with claim 7, wherein the shell is fabricated substantially from a nickel-plated steel material.

11. The monitoring system in accordance with claim 7, wherein the first housing further comprises a plurality of ventilation openings extending therethrough.

12. The monitoring system in accordance with claim 7, wherein the first gasket is positioned between the front portion and the at least one monitoring module when the at least one monitoring module is positioned within the interior cavity.

13. A method of retrofitting a monitoring system, the method comprising:
providing a first housing that comprises a first backplane and at least one legacy monitoring module positioned therein;
removing the at least one legacy monitoring module from the first housing;
inserting a second housing at least partially within the first housing, wherein the second housing comprises:
  a shell defining an interior cavity, wherein the shell comprises a rear portion defining at least one opening in flow communication with the interior cavity; and
  at least one gasket coupled to the rear portion, the at least one gasket facilitates insulating the interior cavity from electromagnetic radiation; and
  a second backplane;
coupling the first backplane to the second backplane with at least one interface board; and
inserting at least one upgraded monitoring module into the second housing.

14. The method in accordance with claim 13, wherein inserting at least one upgraded monitoring module into the second housing comprises inserting at least one upgraded monitoring module that processes signals that have a higher speed than signals processed by the at least one legacy monitoring module.

15. The method in accordance with claim 13, wherein inserting at least one upgraded monitoring module into the second housing comprises coupling the at least one upgraded monitoring module to the second backplane.

16. The method in accordance with claim 15, wherein the at least one gasket is coupled to a perimeter of the at least one opening, and wherein coupling the second backplane to the at least one interface board comprises coupling the second backplane to the at least one interface board through the at least one opening such that the at least one gasket substantially seals the at least one opening.

* * * * *